United States Patent [19]

McElheny et al.

[11] Patent Number: 4,757,610
[45] Date of Patent: Jul. 19, 1988

[54] SURFACE MOUNT NETWORK AND METHOD OF MAKING

[75] Inventors: Donald C. McElheny, Delevan; Dale A. Ponivas, West Seneca, both of N.Y.

[73] Assignee: American Precision Industries, Inc., Buffalo, N.Y.

[21] Appl. No.: 110,323

[22] Filed: Oct. 20, 1987

Related U.S. Application Data

[63] Continuation-in-part of Ser. No. 831,582, Feb. 21, 1986, abandoned.

[51] Int. Cl.⁴ .................. H05K 3/30; B65D 73/02
[52] U.S. Cl. ............................. 29/832; 29/613; 206/328; 357/72; 361/433
[58] Field of Search .......... 29/613, 619, 621, 832, 29/834, 836, 840; 357/72; 361/400, 403, 405, 433

[56] References Cited

U.S. PATENT DOCUMENTS

| | | |
|---|---|---|
| 1,932,650 | 12/1930 | Weiscopf . |
| 2,441,960 | 5/1948 | Eisler . |
| 2,552,626 | 5/1951 | Fisher et al. . |
| 2,777,039 | 1/1957 | Thias . |
| 2,903,666 | 9/1959 | Krellner . |
| 3,272,909 | 9/1966 | Bruck et al. . |
| 3,302,272 | 2/1967 | Braun . |
| 3,345,598 | 10/1967 | Lutz . |
| 3,346,775 | 10/1967 | Christiansen . |
| 3,410,949 | 11/1968 | Tischler . |
| 3,444,436 | 5/1969 | Coda . |
| 3,456,159 | 7/1969 | Davis, Jr. et al. . |
| 3,550,228 | 12/1970 | Asscher . |
| 3,697,818 | 10/1972 | Boursin ............................. 357/72 X |
| 3,930,306 | 1/1976 | Goldberg et al. . |
| 3,967,296 | 6/1976 | Intrator . |
| 4,208,005 | 6/1980 | Nate et al. . |
| 4,267,927 | 5/1981 | English, Jr. .................. 206/328 X |
| 4,312,692 | 1/1982 | Ikeda et al. . |
| 4,337,453 | 6/1982 | Nagashima et al. . |
| 4,339,785 | 7/1982 | Ohsawa . |
| 4,349,860 | 9/1982 | Ohsawa . |
| 4,417,298 | 11/1983 | Nakata et al. .................. 361/433 C |
| 4,449,769 | 5/1984 | Kobayashi et al. . |
| 4,489,487 | 12/1984 | Bura . |
| 4,542,439 | 9/1985 | Dick . |
| 4,564,885 | 1/1986 | McCann ......................... 357/72 X |

*Primary Examiner*—Howard N. Goldberg
*Assistant Examiner*—Carl J. Arbes
*Attorney, Agent, or Firm*—Christel, Bean & Linihan

[57] ABSTRACT

Surface mount networks and methods of making. One form of a network is a single in-line network. According to one method all components are mounted within a bar stock of generally rectangular cross section, the components have end caps disposed over a cylindrical body portion, which body portion is received within grooves on the bar stock material, and the end caps extending to the sides of the bar stock. A portion each of the end caps lies in a plane to one side of the bar stock so that the network can be mounted on the conductive traces of a printed circuit board. The single in-line network may also be molded to its final configuration. In another form two in-line networks are provided with a bus between adjacent end caps, a portion of the cylindrical wall surface of the end caps lying in a common plane on the periphery of the network and being adapted to be surface mounted onto the conductive traces of a printed circuit board. In another design two in-line networks are assembled together in such a manner that the planar end portion of the end caps may be surface mounted onto the conductive traces of a printed circuit board. Multiple in-line networks can be made by assembling individual components or by molding.

24 Claims, 2 Drawing Sheets

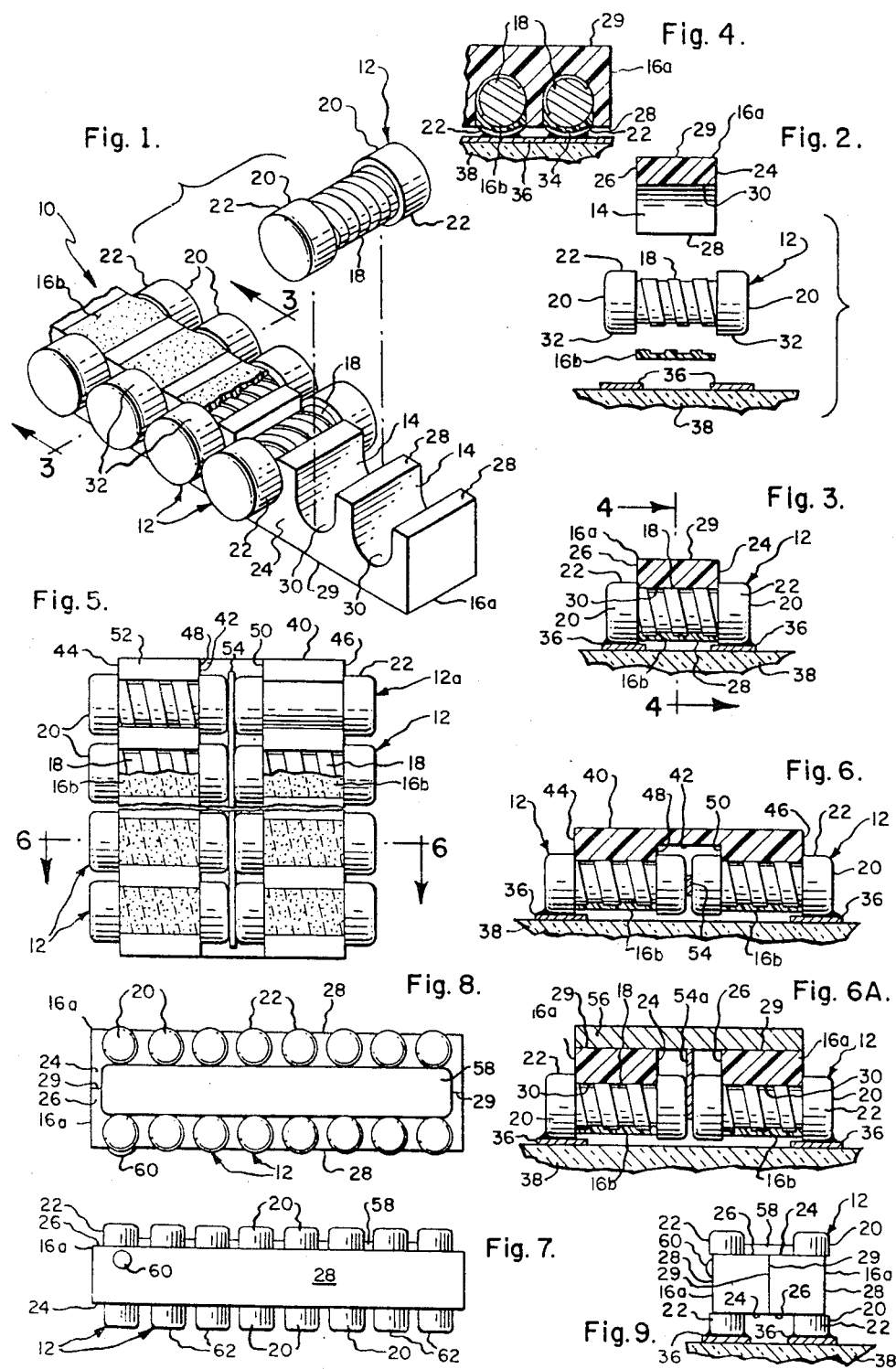

SURFACE MOUNT NETWORK AND METHOD OF MAKING

CROSS REFERENCE TO RELATED APPLICATIONS

The present application is a continuation-in-part of U.S. patent application Ser. No. 06/831,582 filed Feb. 21, 1986 entitled SURFACE MOUNT NETWORK AND METHOD OF MAKING now abandoned.

TECHNICAL FIELD

The present invention relates generally to an assembly of electrical components on a common support, hereinafter called a network, said network capable of being mounted on the surface of a printed circuit board. The present invention also relates to a method of making said network.

BACKGROUND OF THE INVENTION

When printed circuit boards were initially developed, it was common practice to mount various individual electrical components on one surface of the board, the mounted components having leads which extended through apertures on the board, the leads being electrically connected to the conductive traces on the other side of the printed circuit board by soldering or the like. Since the original development of printed circuit boards, there has been a demand for components which can be surface mounted on the board, that is to say in direct contact with the printed circuit on the board. Various differing designs of individual components have been developed for surface mounting and typical designs are shown in U.S. Pat. Nos. 2,777,039; 3,444,436; 3,550,228; 3,967,296; 4,208,005; 4,312,692; 4,339,785; 4,349,860 and 4,542,439.

There has also been a requirement for a network of electrical components which can be mounted on a circuit board, one such example being U.S. Pat. No. 4,337,453 wherein selected leads of a plurality of leads are passed through apertures in a printed circuit board and electrically connected to the circuit on the opposite side of the board when mounting the network. While the various devices referred to above have been satisfactory for their intended purposes, there still remains a demand for a network which can be surface mounted on a printed circuit board.

OBJECTS AND SUMMARY OF THE INVENTION

It is an object of the present invention to provide a network which can be surface mounted on a printed circuit board.

It is a further object of the present invention to provide a method of making such a network.

The above objects and other objects and advantages of this invention will be more fully appreciated from a consideration of the following detailed description taken in conjunction with the accompanying drawings in which preferred forms of this invention are illustrated.

BRIEF DESCRIPTION OF THE DRAWINGS

FIG. 1 illustrates one method of assembling varying components to make one form of the surface mount network.

FIG. 2 is an exploded partial sectional view of the surface mount network shown in FIG. 1 and also illustrating a portion of a printed circuit board.

FIG. 3 is a section taken generally along the line 3—3 in FIG. 1 of a completed first form of surface mount network, the network being inverted and shown mounted on a printed circuit board.

FIG. 4 is a section taken generally along the line 4—4 in FIG. 3.

FIG. 5 shows a second form of a surface mount network, parts being broken out for purposes of clarity.

FIG. 6 is a section taken generally along the line 6—6 in FIG. 5, this section also being inverted and shown mounted on a printed circuit board.

FIG. 6A is a view similar to FIG. 6 showing an alternate construction of the second form of the surface mount network of FIGS. 5 and 6.

FIGS. 7, 8 and 9 are side, top and end views, respectively, of a third form of the surface mount network of this invention.

DETAILED DESCRIPTION

Figure 10:
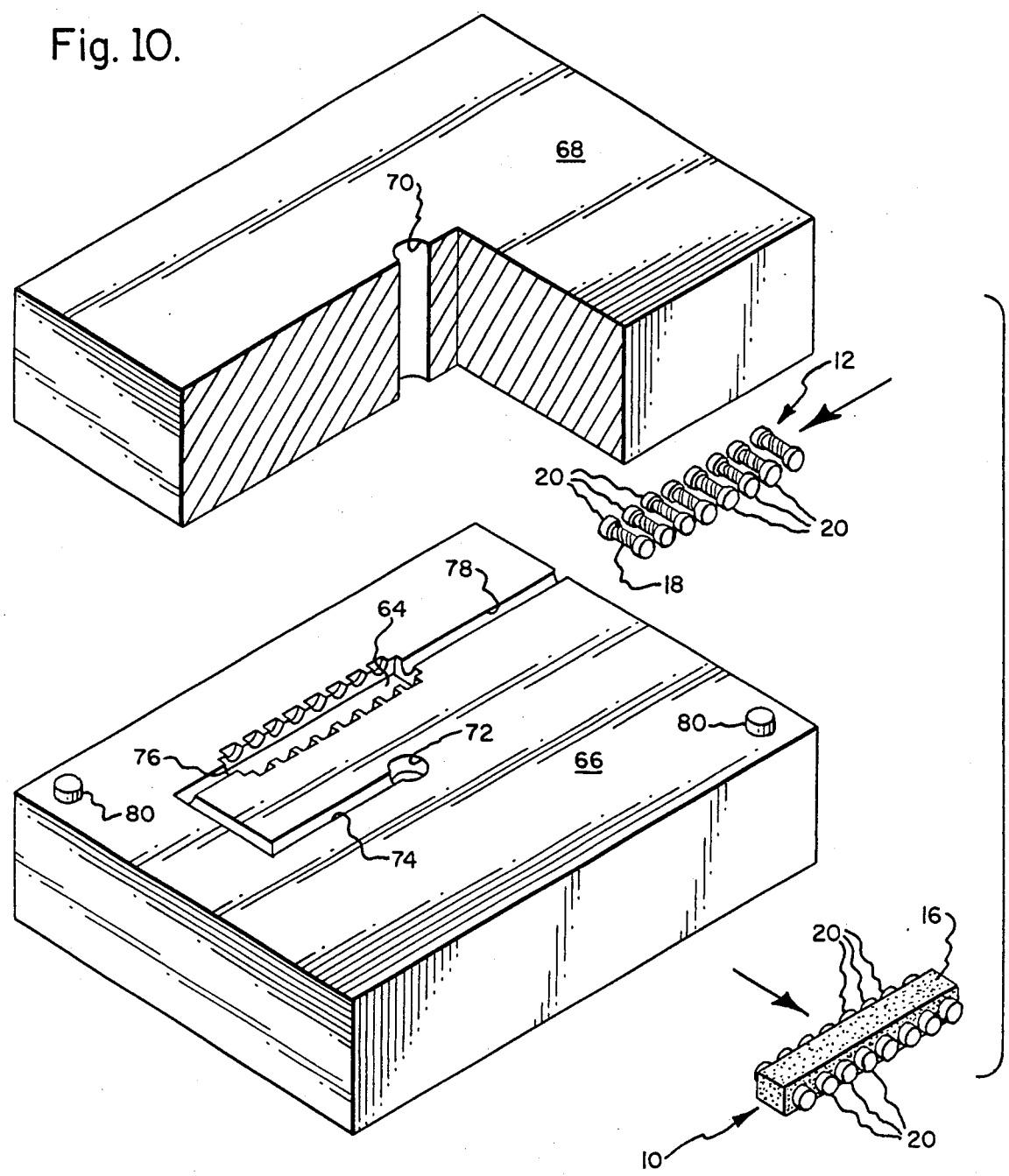
FIG. 10 is a schematic illustration showing how individual electrical components can be molded into a network.

In the following detailed description, a network formed of resistors is illustrated. However, it should be appreciated that other electrical components could be assembled into the network, it only being necessary that the electrical components be provided with an elongated component body and end caps mounted on opposite ends of the elongated component body.

A first form of resistor network is illustrated in FIGS. 1-4, this form being a single in-line resistor network. The network, indicated generally at 10, includes a column or array of a plurality of identically dimensioned resistors, indicated generally at 12, which are disposed within a rigid common dielectric support 16. Each of the resistors consists of a cylindrical resistance body 18 consisting of an aluminous slug having a spirally cut nichrome layer and a pair of electrically conductive end caps 20, the cylindrical walls 22 of the end caps being press fit onto opposite ends of the aluminous slug.

The rigid common support 16 which is illustrated in FIGS. 1-4 is a rigid bar stock 16a of dielectric material which may be initially of a generally rectangular cross section having parallel sides 24 and 26, and parallel surfaces 28 and 29 at right angles to the surface 24 and 26. Grooves 14 are formed in the bar stock in such a manner that they are parallel to each other and at right angles to parallel sides 24, 26. Thus, the grooves can be cut into surface 28 of the bar stock, or alternatively the support 16a can be molded to its final form. The distance between the two parallel sides 24, 26 of the support 16 is equal to or preferably slightly less than the distance of the elongated component body 18 between end caps 20. The grooves 14 are identically dimensioned and each groove has a cylindrical bottom 30, all bottoms 30 lying in a common plane parallel to the surface 28. The depth of the grooves 14 from the surface 28 does not exceed the diameter of the cylindrical component body plus the thickness of a cylindrical wall 22 so that after the components 12 are fully mounted within the grooves an exposed exterior surface portion 32 of the end caps will project above the surface 28. As the grooves 14 are identically dimensioned and as their bottoms 30 lie in a common plane, and also since the resistors 12 are identically dimensioned, the exposed surface portion 32 of each end cap will lie in a common plane on the periphery of the network. In order to complete the assembly, the support further includes dielectric material 16b which is placed over the surface portion of the component bodies which is initially exposed after the component body has been placed within the grooves 14 of the bar stock 16. The thickness of the insulating material is such that it does not project beyond the common plane defined by the exposed portions 32. As the plane of the exposed portions 32 are on the periphery of the network, these portions can be mounted upon the conductive traces 36 of a printed circuit board 38.

Before the resistors are placed in the grooves 14 it may be desirable to put an adhesive in the groove to rigidly secure the resistor in place within the groove, such an adhesive, for example, being a one component epoxy which glues when heated. The insulation which is placed over the resistors after they have been placed in the grooves can be a liquid epoxy or any other suitable material. In any event, it is essential that the exposed portions 32 of the end caps which are to contact the conductive trace 36 on the printed circuit board all lie in the same plane and thus dimensioning is very critical.

It is also necessary that the metalized aluminous slug be completely sealed from moisture from end cap to end cap. This can be accomplished by the assembly procedure set forth above. However, in some situations, this will be done as a separate step. Thus, after the end caps have been applied to the nichrome coated aluminous slug, the slug can be coated with a suitable moisture proofing coating from end cap to end cap.

While a single in-line network has been illustrated in FIGS. 1-4, it may be desirable to produce dual in-line networks or a plurality of in-line networks. Dual in-line networks are illustrated in FIGS. 5-9. The forms illustrated in FIGS. 5, 6 and 6A will be called parallel dual in-line networks in that the resistors will be mounted parallel to the surface of the printed circuit board. Similarly, the forms shown in FIGS. 7-9 will be referred to as perpendicular dual in-line networks. Referring now in greater detail in FIGS. 5 and 6, in this form, a rigid common support 40 of dielectric material, which again can initially be of rectangular cross section, is initially provided with a channel 42, the channel being parallel to parallel sides 44, 46. The channel will also be of rectangular cross section and it too will have parallel adjacent sides 48, 50. On the further surface 52 between the parallel sides 44, 46, two rows of parallel grooves are formed, one row extending between surfaces 44 and 48 and the other row extending between surfaces 46 and 50. The distance between the surfaces 44 and 48 and also between the surfaces 50 and 46 is less than, but preferably nearly equal to, the length of the component body between the end caps of the resistors which are to be placed in the grooves. In addition, the distance between the surfaces 48 and 50 is at least equal to the length of a pair of adjacent end caps and preferably is sufficiently wide so that a common bus 54 may be electrically connected between adjacent end caps. As can be seen from FIG. 6, in most applications only the outermost end caps will be secured to the conductive traces.

Referring now to FIG. 6A which shows a variation of the design of FIGS. 5 and 6, it can be seen that a parallel dual in-line resistor network can also be constructed by mounting two single in-line resistor networks on a common support 56 by welding or by utilizing a suitable adhesive, the common support 56 being substantially rigid. The common bus 54a, which extends between the end caps, may be of a ribbon form rather than the wire form shown in FIG. 6 to facilitate the assembliy of the parts.

When using a single in-line resistor network of the design of FIG. 1, resistors will be selected for insertion into the grooves, which resistors may correspond to the required values of a particular circuit, or which alternatively may be a range of resistors. In the design illustrated in FIGS. 5 and 6, or the design of FIG. 6A, one of the selected resistors 12a may be a zero ohm resistor. (A zero ohm resistor has a cylindrical copper core disposed between its end caps.) In this form of the invention, the resistors may be selected having differing values and by properly connecting the end caps to the conductive traces on the printed circuit board, a wide variety of values may be secured from a single network package.

A perpendicular dual in-line resistor network is illustrated in FIGS. 7-9. In this form, two single in-line resistor networks are adhered to each other along each surface 29. The two in-line resistors can be identically dimensioned, as illustrated, or they may have varying spacings between the individual resistors. When the two in-line resistor networks are assembled a common bus 58 is placed between adjacent end caps 20. Again one of the various components may be a zero ohm resistor. While the design shown in FIGS. 7-9 utilizes two separate single inline resistor networks which are adhered to each other, an alternate design may be to employ a common rigid support which is then provided with two rows of identically dimensioned grooves on opposite sides, the electrical components then being placed within the various grooves. Insulation is then placed over the resistors after they have been placed in the grooves in a manner similar to that illustrated in FIG. 1. The design is such that the planar surface 62 of the end caps not connected to bus 58 all lie in a common plane on the periphery of the network.

In the various network resistors described above, an indicator may be provided on the common support to indicate one of the electrical components to facilitate assembly onto a printed circuit board. Thus, as shown in FIGS. 7 and 9, an indicator 60 may be provided. While an indicator has only been shown in connections with the design of FIGS. 7-9, it should be obvious that an indicator may be provided in any network design of this invention.

While the resistor networks shown in the various figures have been described thus far as built-up assemblies, it should be appreciated that other methods may be utilized to form the single resistor networks. Thus, with respect to FIGS. 1-4, the support 16 can be an integral piece of rigid dielectric material molded about the resistors 12. More specifically, with reference to FIG. 10, individual resistors 12 can be suitably positioned in a mold cavity 64 in the lower half of a mold. When the mold cavity is closed by bringing the top half 68 and the bottom half 66 together, the end caps will be engaged by the mold. It is then only necessary to introduce the molding material through feed 70, feeder base 72, runner 74, and gate 76, the air within the mold being bled to atmosphere through bleed 78. As is conventional, the lower mold half 66 is provided with suitable alignment pins 80 which are received within suitable bushings (not shown) in the upper mold half 68. If this were the case, opposed end caps 20 would be supported by a suitable mold in a columnar array, the support then being molded about the cylindrical resistance bodies to the final form. If desired, the resistance bodies can be coated prior to molding with a moisture resistant material. Hoewver, in most molding processes, such as transfer molding, compression molding, and injection molding, if there is suitable adhesion between the molding material and the cylindrical resistance bodies, it will not be necessary to provide any additional moisture resistance material. The final molded product will not have the end caps covered with molding material, at least upon the surface which is to be in contact with the conductive traces 36 on the printed circuit board, and if there is any flashing material in this area, it can readily be removed. Any flashing which is present to the sides of the support 16 will not have to be removed unless it is excessive. While only one form of a suitable mold is illustrated in the drawings, the design of various other molds should be obvious to one having ordinary skill in the molding art from the above description.

A parallel dual in-line resistor network may also be formed by molding wherein opposed end caps of aligned resistors are firmly held by a mold to maintain adjacent pairs in relatively coaxially alignment, the common bus either being secured between adjacent end caps prior to molding or by inserting a mold resist material between end caps prior to molding, the resist material subsequently being removed and the common bus then being secured between adjacent caps.

Additionally, the perpendicular dual in-line resistor network can also be formed by a molding process wherein all of the end caps shown at the bottom in FIG. 7 are placed within suitable apertures in the bottom of a mold, and the molding material being molded up to the top surface 26 shown in FIG. 7. The bus 58 can then be inserted.

The various networks of this invention can be assembled onto the surface of a printed circuit board by conventional methods. Thus, the completed components can be picked and placed onto the conductive strips of the board, which would initially have a solder paste on the board where the desired connections are to be made, and which could also have an adhesive to hold the network on the board. The board is then heated to melt the solder paste and to set an adhesive if an adhesive is used. After these steps are performed, the printed circuit board is then washed.

What is claimed is:

1. A method of making a network comprising the following steps:
    providing a plurality of electrical components each including an elongated component body having spaced apart first and second ends, a first electrically conductive end cap mounted on the first end and a second electrically conductive end cap mounted on the second end, the first and second end caps each having an initially exposed exterior surface; and
    incorporating said components in a rigid dielectric support in such a manner that one portion the exterior surface of at least one of said first and second end caps of all of the electrical components is exposed, all of said one portions lying in a common plane on the periphery of the assembly.

2. The method as set forth in claim 1 wherein said components are incorporated in said rigid dielectric support by assembling the components in said support.

3. The method as set forth in claim 2 wherein a surface portion of the elongated component body after initial assembly with said support is exposed and including the further step of placing insulating material over the exposed portion of the component bodies to enclose all of the component bodies, said insulating material after placing not projecting beyond said common plane.

4. The method as set forth in claim 2 wherein the rigid dielectric support has two parallel side surfaces, said support being provided with a plurality of grooves between the two parallel side surfaces, the distance between the two parallel surfaces being less than the distance of the elongated component body between the first and second end caps on said body, the initial assembly step including placing the elongated component body within associated grooves.

5. The method as set forth in claim 4 wherein the rigid support is provided with two rows of parallel grooves, and wherein a bus is provided, and further including the step of electrically connecting one end cap of each electrical component to said bus.

6. The method as set forth in claim 1 including the step of interconnecting two supports to each other to form a dual in-line network assembly, and wherein a bus is provided, and further including the step of electriclly connecting one end cap of each electrical component to said bus.

7. The method as set forth in claim 1 wherein said components are incorporated in said rigid dielectric support by initially positioning the components in their final position, and then molding the rigid dielectric support about the elongated component body of the electrical components.

8. The method set forth in claim 7 wherein the components are initially positioned in a single in-line configuration.

9. The method set forth in claim 7 wherein the components are initially positioned in a dual in-line configuration.

10. The method as set forth in claim 1 wherein said body is coated with a suitable moisture proofing coating from the first end cap to the second end cap prior to the initial assembly step.

11. A method of making a resistor network comprising the following steps:
    providing a plurality of resistors, each resistor including a cylindrical resistance body having first and second spaced apart ends, a first electrically conductive end cap mounted on the first end of the cylindrical resistance body, a second electrically conductive end cap mounted on said second end of the cylindrical resistance body, and each of the first and second end caps having an exposed exterior surface;
    providing a rigid common support for said resistors consisting of a bar stock of dielectric material, said bar stock having two parallel surfaces, the width between the parallel surfaces not being greater than the distance between adjacent ends of the first and second end caps on a resistor, said bar stock further having a further surface between said parallel surfaces, said further surface being provided with a plurality of grooves which are parallel to each other, said grooves extending from one of said parallel surfaces to the other said parallel surfaces;
    selecting two or more resistors from said plurality of resistors for assembly within said common support;

initially assembling the cylindrical resistance body between the first and second end caps of each of the selected resistors within an associated groove with the first and second end caps of the mounted resistors extending to the sides of the common support, one portion of the exterior surface of the first and second end caps of all of the mounted resistors being exposed, all of said one portions lying in a common plane, and a portion of the cylindrical body between the end caps being exposed; and placing insulating material over the exposed portion of the cylindrical resistance body to enclose the cylindrical body between the first and second end caps, the insulating material after placing not projecting bdyond said common plane.

12. The method as set forth in claim 10 wherein said resistors are all substantially identically dimensioned, the resistance body being an aluminous slug having a spirally cut nichrome layer, the end caps having cylindrical walls press fitted over opposed ends of the aluminous slug, the bar stock being of generally rectangular cross section, the grooves being substantially identically dimensioned and parallel to each other and at right angle to the parallel sides of the bard stock, each of the grooves having a cylindrical bottom, all of the bottoms lying in a common plane, and the depth of the grooves not exceeding, the diameter of an aluminous slug plus the thickness of the cylindrical wall of an end cap.

13. A network assembly adapted to be mounted on the surface of a printed circuit board, said network comprising:

rigid common support means; and a plurality of selected electrical components incorporated in said rigid common support means, each component including an elongated component body and a pair of electrically conductive end caps mounted on opposite ends of said component body, an exposed exterior surface portion of at least one end cap of each of said plurality of electrical components lying in a common plane on the periphery of the assembly.

14. The network assembly as set forth in claim 13 wherein each of said electrical components is a resistor, one of which resistors may be a zero ohm resistor, and the other of said resistors including a cylindrical aluminous slug having a spirally cut nichrome layer, and wherein each of said end caps has cylindrical walls press fitted over the opposed ends of the aluminous slug.

15. The network assembly as set forth in claim 13 wherein said common support means has a plurality of grooves extending between parallel side surfaces, each of said grooves receiving a portion of an elongated component body of an associated electrical component which lies between the end caps.

16. The network assembly as set forth in claim 15 wherein the plurality of grooves are parallel to each other and at right angles to the parallel surfaces.

17. The network assembly as set forth in claim 15 wherein the elongated component body between end caps of the selected electrical components is enclosed within said rigid common support means and a dielectric material, said dielectric material being so dimensioned that it does not break said common plane.

18. The network means as set forth in claim 15 wherein said rigid common support means is a bar stock of dielectric material having a width between said parallel surfaces less than the distance of the elongated component body between said pair of end caps.

19. The network assembly as set forth in claim 15 wherein said rigid common support means is a bar stock of dielectric material having two rows of spaced apart parallel grooves lying in a common plane, the space between the two rows being at least as great as the length of two end caps, one end cap of each component being received within said space, and wherein a common bus is electrically connected to adjacent end caps.

20. The network assembly as set forth in claim 17 wherein said rigid common support means is formed from two generally rectangular cross-section bar stocks of dielectric material, each bar stock having one row of parallel grooves on one surface, the bar stocks being interconnected to each other, and wherein one end cap of all of the electrical components received within the grooves is connected with each other by a common bus.

21. The network assembly as set forth in claim 20 wherein each of the two bar stocks is secured to the surface of another support in such a manner that all of the electrical components lie in a common plane.

22. The network assembly as set forth in claim 20 wherein the two bar stocks are secured to each other in such a manner that the network assembly has one row of parallel grooves on one side and another row of parallel grooves on an opposite side.

23. A network assembly adapted to be mounted on the surface of a printed circuit board, said network comprising:

a plurality of substantially identically dimensioned resistors, each resistor including a cylindrical resistance body and opposed electrically conductive end caps having cylindrical walls disposed over opposed ends of the cylindrical body;

a rigid common support of dielectric material, said common support having parallel sides, the width between the parallel sides not being greater than the distance between the opposed end caps on a resistor, said common support further having a surface between said parallel sides having a plurality of identically dimensioned grooves extending between said sides, said resistors being assembled within said grooves, an exposed exterior surface portion of the end caps of the assembled resistors lying in a common plane on the periphery of the assembly.

24. The network as set forth in claim 23 wherein each groove has a cylindrical bottom, all bottoms lying in a common plane, the depth of the grooves not exceeding the diameter of the cylindrical body plus the thickness of an end cap cylindrical wall.

* * * * *

UNITED STATES PATENT AND TRADEMARK OFFICE
CERTIFICATE OF CORRECTION

PATENT NO. : 4,757,610

DATED : July 19, 1988

INVENTOR(S) : Donald C. McElheny and Dale A. Ponivas

It is certified that error appears in the above-identified patent and that said Letters Patent are hereby corrected as shown below:

Claim 11, last line (column 7, line 16), "bdyond" should be --beyond--.

Signed and Sealed this

Thirteenth Day of December, 1988

Attest:

DONALD J. QUIGG

*Attesting Officer*  *Commissioner of Patents and Trademarks*